(12) United States Patent
Jungnickel et al.

(10) Patent No.: US 7,491,556 B2
(45) Date of Patent: Feb. 17, 2009

(54) EFFICIENT METHOD OF FORMING AND ASSEMBLING A MICROELECTRONIC CHIP INCLUDING SOLDER BUMPS

(75) Inventors: Gotthard Jungnickel, Radeberg (DE); Frank Kuechenmeister, Dresden (DE); Daniel Richter, Radebeul (DE); Marcel Wieland, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 505 days.

(21) Appl. No.: 11/204,279

(22) Filed: Aug. 15, 2005

(65) Prior Publication Data
US 2006/0172444 A1 Aug. 3, 2006

(30) Foreign Application Priority Data
Jan. 31, 2005 (DE) .................. 10 2005 004 360

(51) Int. Cl.
*H01L 21/66* (2006.01)
*G01R 31/26* (2006.01)
(52) U.S. Cl. .................. 438/15; 257/E21.522
(58) Field of Classification Search ......... 438/612–614, 438/15; 257/E21.508, E21.522
See application file for complete search history.

(56) References Cited

U.S. PATENT DOCUMENTS

| 6,413,851 | B1 * | 7/2002 | Chow et al. ............ 438/613 |
| 6,501,185 | B1 * | 12/2002 | Chow et al. ............ 257/780 |
| 6,624,060 | B2 * | 9/2003 | Chen et al. ............ 438/613 |
| 6,941,957 | B2 * | 9/2005 | Chen et al. ............ 134/102.1 |
| 7,015,130 | B2 * | 3/2006 | Tsai et al. ............ 438/613 |
| 7,329,951 | B2 * | 2/2008 | Daubenspeck et al. ..... 257/737 |
| 7,348,210 | B2 * | 3/2008 | Daubenspeck et al. ..... 438/106 |
| 2004/0110364 | A1 | 6/2004 | Tsai et al. ............ 438/597 |
| 2004/0166661 | A1 | 8/2004 | Lei ............ 438/614 |

FOREIGN PATENT DOCUMENTS

| EP | 0 951 069 A1 | 10/1999 |
| JP | 2003023022 A | 1/2003 |

* cited by examiner

*Primary Examiner*—David A Zarneke
(74) *Attorney, Agent, or Firm*—Williams, Morgan & Amerson, P.C.

(57) ABSTRACT

The present invention provides a new technology approach for forming a contact layer in a microelectronic chip, which includes a plurality of solder bumps that are directly to be connected with a correspondingly designed carrier substrate. In the process flow, a plasma-based process for patterning the underbump metallization layer is used in combination with testing and assembling the device, thereby providing a high degree of process flexibility and/or cost reduction and/or device performance.

8 Claims, 3 Drawing Sheets

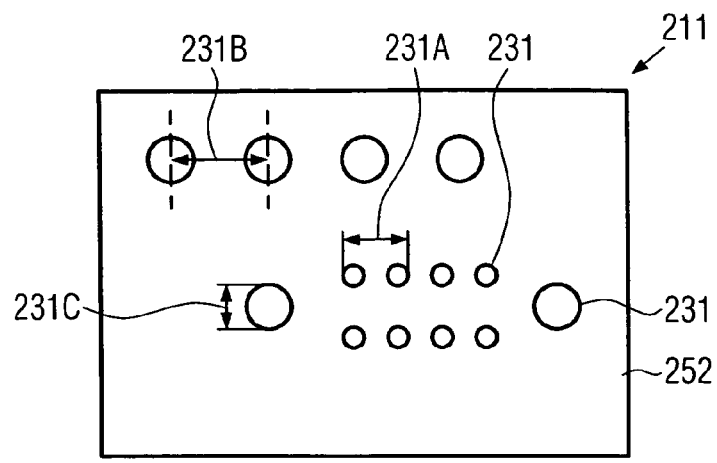
FIG. 2b
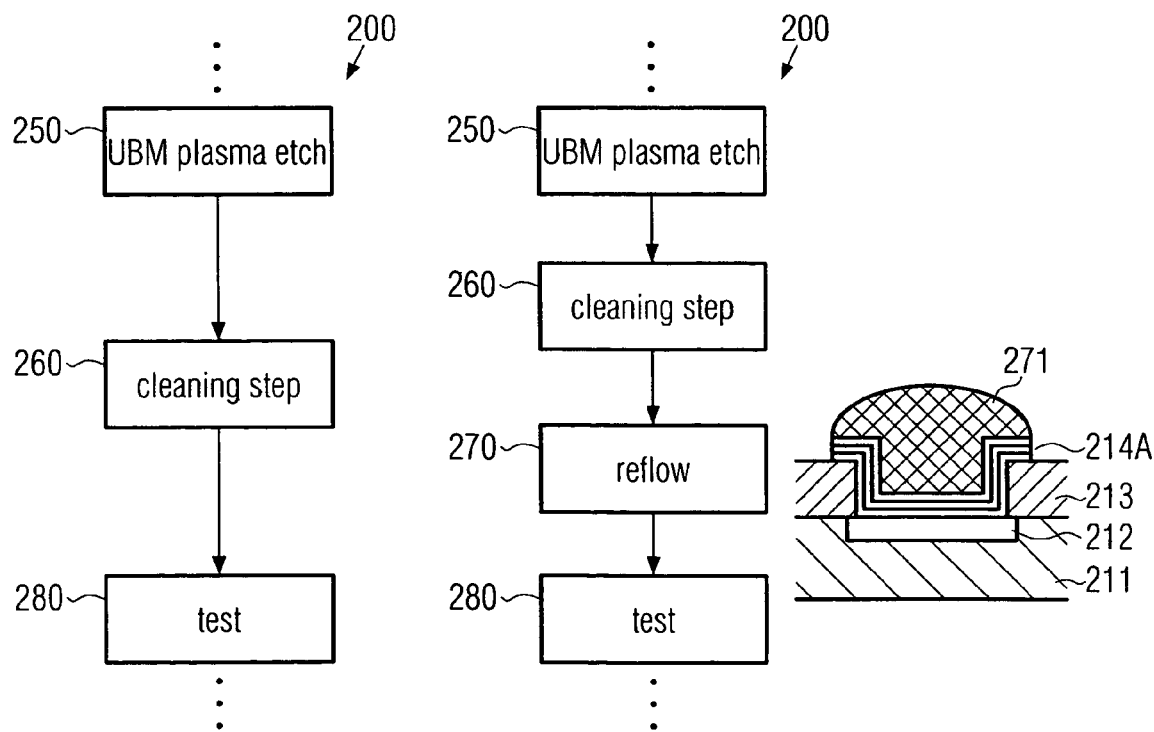
FIG. 2c
FIG. 2d

EFFICIENT METHOD OF FORMING AND ASSEMBLING A MICROELECTRONIC CHIP INCLUDING SOLDER BUMPS

BACKGROUND OF THE INVENTION

1. Field of the Invention

The present invention relates to a process flow for forming a contact layer including solder bumps, which is used to provide contact areas for directly attaching an appropriately formed package or carrier substrate to a die carrying an integrated circuit.

2. Description of the Related Art

In manufacturing integrated circuits, it is usually necessary to package a chip and provide leads and terminals for connecting the chip circuitry with the periphery. In some packaging techniques, chips, chip packages or other appropriate units may be connected by means of solder balls, formed from so-called solder bumps, that are formed on a corresponding layer, which will be referred to herein as a contact layer, of at least one of the units, for instance on a dielectric passivation layer of the microelectronic chip. In order to connect the microelectronic chip with the corresponding carrier, the surfaces of two respective units to be connected, i.e., a microelectronic chip comprising, for instance, a plurality of integrated circuits, and a corresponding package, have formed thereon adequate pad arrangements to electrically connect the two units after reflowing the solder bumps provided at least on one of the units, for instance on the microelectronic chip. In other techniques, solder bumps may have to be formed that are to be connected to corresponding wires, or the solder bumps may be brought into contact with corresponding pad areas of another substrate acting as a heat sink. Consequently, it may be necessary to form a large number of solder bumps that may be distributed over the entire chip area, thereby providing, for example, the I/O capability required for modern microelectronic chips that usually include complex circuitry, such as microprocessors, storage circuits and the like and/or include a plurality of integrated circuits forming a complete complex circuit system.

In order to provide hundreds or thousands of mechanically well-fastened solder bumps on corresponding pads, the attachment procedure of the solder bumps requires a careful design since the entire device may be rendered useless upon failure of only one of the solder bumps. For this reason, one or more carefully chosen layers are generally placed between the solder bumps and the underlying substrate or wafer including the pad arrangement. In addition to the important role these interfacial layers, herein also referred to as underbump metallization layers, may play in endowing a sufficient mechanical adhesion of the solder bump to the underlying pad and the surrounding passivation material, the underbump metallization has to meet further requirements with respect to diffusion characteristics and current conductivity. Regarding the former issue, the underbump metallization layers have to provide an adequate diffusion barrier to prevent the solder material, frequently a mixture of lead and tin, from attacking the chip's underlying metallization layers and thereby destroying or negatively affecting their functionality. Moreover, migration of solder material, such as lead, to other sensitive device areas, for instance into the dielectric, where a radioactive decay of lead may also significantly affect the device performance, has to be suppressed highly efficiently by the underbump metallization. Regarding current conductivity, the underbump metallization, which serves as an interconnect between the solder bump and the underlying metallization layer of the chip, has to exhibit a thickness and a specific resistance that does not inappropriately increase the overall resistance of the metallization pad/solder bump system. In addition, the underbump metallization will serve as a current distribution layer during electroplating of the solder bump material. Electroplating is presently the preferred deposition technique, since physical vapor deposition of solder bump material, which is also used in the art, requires a complex mask technology in order to avoid any misalignments due to thermal expansion of the mask while it is contacted by the hot metal vapors. Moreover, it is extremely difficult to remove the metal mask after completion of the deposition process without damaging the solder pads, particularly when large wafers are processed or the pitch between adjacent solder pads decreases.

Although a mask is also used in the electroplating deposition method, this technique differs from the evaporation method in that the mask is created using photolithography to thereby avoid the above-identified problems caused by physical vapor deposition techniques. However, electroplating requires a continuous and uniform current distribution layer adhered to the substrate that is mainly insulative, except for the pads on which the solder bumps have to be formed. Thus, the underbump metallization also has to meet strictly set constraints with respect to a uniform current distribution as any non-uniformities during the plating process may affect the final configuration of the solder bumps and, after reflowing the solder bumps, of the resulting solder balls in terms of, for instance, height non-uniformities, which may in turn translate into fluctuations of the finally obtained electric connections and the mechanical integrity thereof.

After the formation of the solder bumps, the underbump metallization has to be patterned to electrically insulate the individual solder bumps from each other. The resulting islands of underbump metallization, obtained by highly complex isotropic etch processes including wet chemical and/or electrochemical etch procedures with complex chemistry, also significantly determine the functionality and configuration of the solder balls, since the etch chemistry may result in under-etching of the solder bumps which act as a mask during the wet chemical etch process. Consequently, a varying degree of under-etch may result in a varying size of the resulting underbump metallization islands associated with each solder bump, thereby significantly affecting the configuration of the solder ball after reflow as the highly wettable underbump metallization substantially determines the flow behavior of the solder material and thus the finally obtained size and hence the height of the solder ball. Moreover, due to the complexity of the wet etch chemistry and the etch recipes, a plurality of cleaning steps are required during the patterning of the underbump metallization, thereby contributing to overall production cost. After patterning the underbump metallization, a final cleaning process is performed to remove contaminants and byproducts of the preceding etch processes from the solder bump prior to reflowing the solder bump. After reflow and testing the solder balls, the device may be assembled by attaching it to a correspondingly designed carrier.

FIG. 1 depicts in more detail a typical conventional process flow 100 for forming a contact layer and attaching complex microelectronic chips directly with a carrier substrate. In step 110, an underbump metallization layer 114 may be formed on a passivation layer 113 formed above a substrate 111, wherein the passivation layer 113 comprises an opening to expose a contact pad 112. Typically, the underbump metallization layer 114 is comprised of a plurality of individual layers, such as a titanium layer, a titanium/tungsten layer and the like, for providing the required adhesion characteristics followed by a barrier layer, such as a chromium, a chromium/copper layer, a nickel layer, a nickel/vanadium layer, providing the diffusion blocking effect, followed, for instance, by a final copper layer that may serve as a current distribution layer. Hereby, the thicknesses of the individual layers of the underbump metallization 114 are in general chosen to optimize the stress/thickness product, the diffusion properties and the mechanical integrity of the entire layer stack. The individual layers of the underbump metallization layer 114 are typically formed by sputter deposition or chemical vapor deposition, depending on the type of material used.

Next, in step 120, a lithography process is performed to form a resist mask 121 above the underbump metallization layer 114, wherein the resist mask 121 has an opening formed therein to define the dimensions and the shape of a solder bump to be formed therein. In step 130, a solder bump 131 is formed by means of the resist mask 121, for instance by electroplating, wherein at least the uppermost layer of the underbump metallization layer 114 acts as an efficient current distribution layer, as already previously described. Thereafter, in step 140, the resist mask 121 is removed by well-known wet chemical strip methods or dry etch techniques. Next, in step 150, the underbump metallization layer 114 is patterned by means of wet chemical or electrochemical etch techniques, which require a highly complex etch chemistry owing to the variety of materials, which individually may per se require complex etch procedures. Moreover, due to the complexity of process steps and etch chemistries, several cleaning steps are usually required for removing any byproducts created during the individual etch procedures. Due to the isotropic nature of these etch processes, a certain degree of under-etching, indicated as 151, may occur which may be dependent on device specific characteristics, such as pattern density, uniformity of the individual etch and clean processes and the like. Especially wet chemical or electrochemical etch processes and corresponding clean processes associated with the patterning of chromium and any alloys thereof require highly sophisticated techniques to ensure that substantially no residuals are left on the passivation layer 121 to keep yield losses due to bump shortage at a low level. Moreover, since the degree of under-etching 151 significantly affects the configuration of the finally obtained bump characteristics, such as bump height, co-planarity and the like, strict layout restrictions on substrate level and even on die level for positioning the solder bumps 131 are to be met to enhance the overall uniformity of the wet or electrochemical etch process 150.

Next, in step 160, a final cleaning step is performed to remove contaminants and byproducts from the preceding step 150 from the solder bump 131, thereby preparing it for a following reflow process in step 170 to form a rounded solder ball 171. During reflow, the solder material, especially any tin contained therein, may form an intermetallic phase with the copper of the uppermost sub layer of the underbump metallization layer 114, thereby creating a reliable metallization interface. In step 180, the solder balls 171 may be tested in view of electrical and/or mechanical functionality. Finally, in step 190, the device represented by the substrate 111 may be assembled, that is, may be attached to a corresponding substrate having formed thereon respective contact pads, which may be brought into contact with the solder balls 171 by reflowing the solder balls 171.

As a result, in the typical conventional process flow 100, a plurality of highly complex steps are involved which require sophisticated process and chemistry control, thereby adding to production cost while at the same time rendering the process flow 100 less flexible, especially in view of reducing the size and pitch of solder bumps as may be necessary in highly complex microelectronic chips.

In view of the situation described above, there is a need for an improved technique for forming a contact layer including solder bumps, wherein one or more of the problems identified above are removed or the effects thereof at least significantly reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique for forming a contact layer of a microelectronic chip, which is adapted to be directly attached to a corresponding carrier substrate by reflowing solder bumps formed on and in the contact layer, wherein an increased degree of flexibility is provided in performing the process flow, thereby offering the potential for saving production cost and/or increasing production yield and/or enhancing device performance. For this purpose, the underbump metallization is patterned after the formation of a plurality of solder bumps, entirely by a per se known plasma etch process and is combined with previous and/or subsequent processes for forming the contact layer and assembling the device, thereby significantly reducing the overall process complexity and also providing enhanced process flexibility of the preceding and subsequent process steps in forming the contact layer and attaching the same to the carrier substrate.

In one illustrative embodiment of the present invention, a method is provided which comprises providing a substrate having formed thereon an underbump metallization layer and a plurality of solder bumps formed above the underbump metallization layer. The method further comprises patterning the underbump metallization layer by a plasma etch process to form a contact layer for bringing the contact layer into contact with a second substrate and testing the contact layer with respect to at least one of electrical and mechanical functionality.

BRIEF DESCRIPTION OF THE DRAWINGS

The invention may be understood by reference to the following description taken in conjunction with the accompanying drawings, in which like reference numerals identify like elements, and in which:

FIGS. 2a-2d schematically represent process flows for forming a contact layer with enhanced process flow flexibility by using a plasma etch process for patterning the underbump metallization layer in accordance with illustrative embodiments of the present invention.

Figure 1:
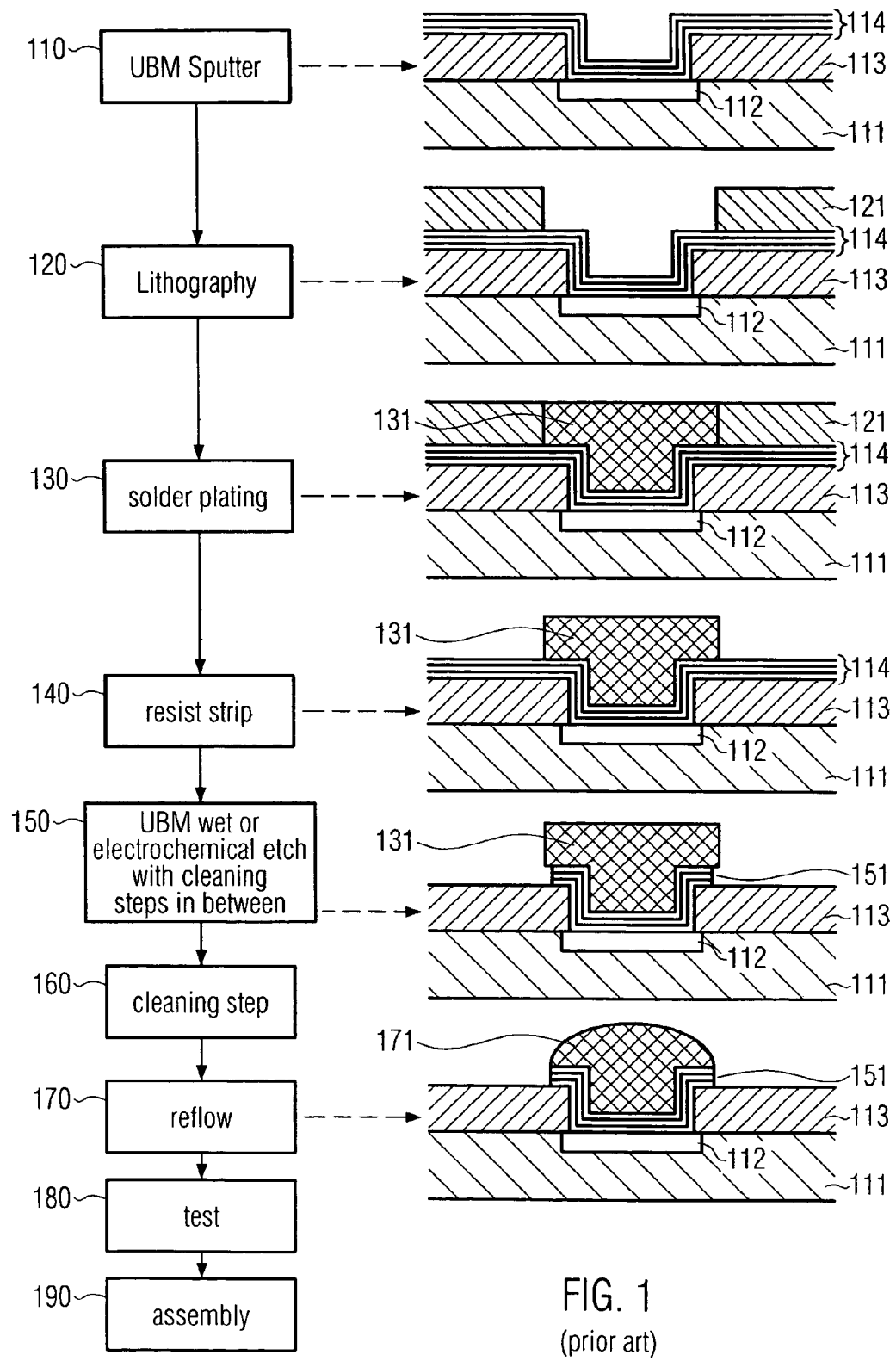
FIG. 1 schematically shows a process flow for forming a contact layer in accordance with a typical conventional technique.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that the formation of a contact layer including a plurality of solder bumps and the testing and the attaching of the contact layer to an appropriate carrier substrate may significantly be enhanced with respect to process flow flexibility and/or production cost savings and/or production yield and/or device performance by re-designing the process flow with the premise of replacing the conventional underbump metallization patterning process, which includes wet chemical processes or electrochemical processes, by a plasma-based etch process, which is known from patterning procedures for forming photolithography masks with high precision and with minimal dependency on pattern density. That is, many photolithography mask formation processes, requiring the patterning of a chromium layer formed on a quartz substrate in accordance with a specified layout relating to a specific device layer, are frequently performed as a dry etch process on the basis of an argon plasma, thereby providing a high degree of anisotropy of the etch process. Hence, any under-etching of the chromium features as may be observed in wet chemical chromium etch processes is reduced. Thus, accordingly designed dry etch processes for removing chromium and chromium alloys enable the formation of precisely defined metal features having dimensions that are comparable to feature sizes also encountered in the formation of contact layers including solder bumps for microelectronic chips. As previously explained, underbump metallization layers required for the formation of reliable contact layers including solder bumps frequently comprise chromium and chromium alloys and copper, the patterning of which conventionally necessitates complex wet chemical etch processes and associated cleaning steps, wherein the isotropic etch behavior of these processes may be highly dependent on structural specifics, such as pattern density of the solder bumps, and the like. Consequently, in the conventional approaches, etch specific characteristics have to be taken into consideration and represent an essential design aspect in forming the underbump metallization layer and in arranging the solder bumps to obtain the required etch uniformity across the substrate. For instance, the etch behavior may significantly depend on the solder bump density within a specific substrate area so that a degree of under-etching may vary in accordance with the pattern density. As a result, in the conventional approach, the final solder bump layout may not be selected merely on the basis of device specific constraints, such as geometrical aspects, e.g., a desired low pitch of neighboring solder bumps, the size and shape of solder bumps, the position of solder bumps with respect to the routing capabilities of the carrier substrate, the position and material composition with respect to the overall performance of the entire metallization stack of the microelectronic chip, the electrical conductivity, the heat dissipation capabilities and the like, but instead a solder bump arrangement is conventionally a compromise between these device specific requirements, such as geometrical, electrical and heat dissipation constraints, and the highly complex etch recipe, thereby significantly comprising the overall performance of the device as one or more of the above device specific constraints may not be addressed as would be desirable. Moreover, by patterning the underbump metallization layer entirely by plasma-based etch processes, the process steps subsequent to the patterning process may also be re-designed and thus performed with higher flexibility and/or higher efficiency since, for instance, the solder bumps may be formed more precisely so that the reflow process prior to testing the functionality of the solder bumps may in some embodiments not be necessary.

Figure 2A:
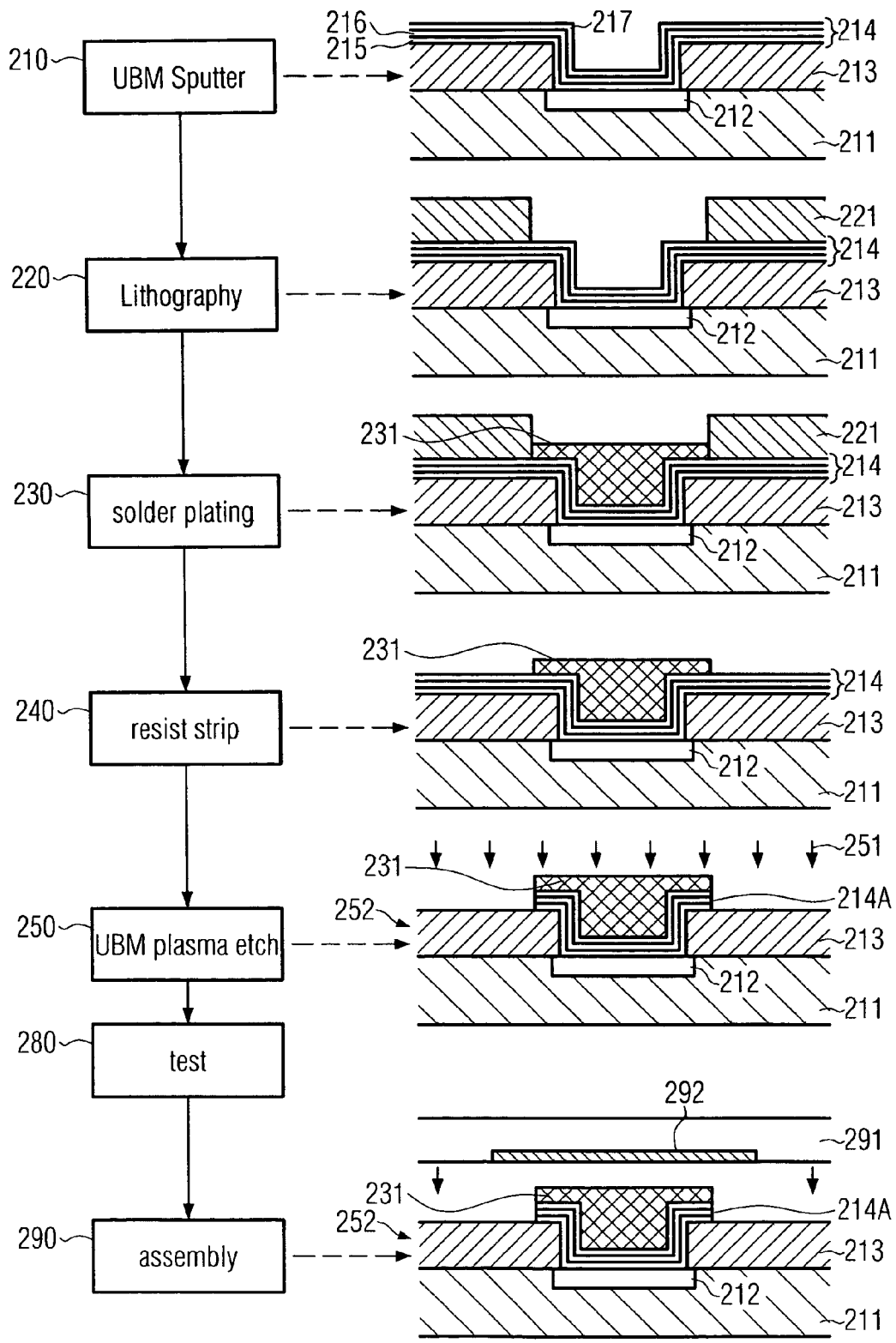

With reference to FIGS. 2a-2d, further illustrative embodiments of the present invention will now be described in more detail. FIG. 2a schematically shows a process flow 200 that is highly efficient in that reflow and cleaning steps may be reduced or avoided. In step 210, an underbump metallization layer 214 is formed above a substrate 211 including a contact pad 212, which may be comprised of any appropriate metal, such as aluminum, copper, copper alloys and the like. Moreover, a passivation layer 213, which may be comprised of one or more sub-layers including materials such as silicon dioxide, silicon nitride, polyimide and the like is formed on the substrate 211 to expose the contact pad 212. The underbump metallization layer 214, which is shown in this embodiment as being comprised of an adhesion layer 215, a barrier layer 216 and a current distribution layer 217, is designed such that the requirements with respect to adhesion, diffusion blocking effects, stress characteristics and current distribution capabilities are met. It should be appreciated that other configurations for the underbump metallization layer 214 may be used as long as the above constraints are fulfilled. In some illustrative embodiments, one of the layers 216 and 217 may include chromium or a chromium alloy due to the superior characteristics with respect to diffusion blocking of lead, tin and other solder materials to be deposited on the underbump metallization layer 214. The underbump metallization layer 214 may be formed by one or more deposition processes such as sputter deposition processes and/or evaporation processes, depending on the material characteristics of the layer under consideration.

In step 220, a lithography process is performed to form a resist mask 221, which exposes that portion of the underbump metallization layer 214 on which solder material is to be deposited. For example, the resist mask 221 may expose substantially that portion of the underbump metallization layer 214 that is formed within the opening in the passivation layer 213. In other embodiments, the size of the opening in the resist mask 221 may be selected to be greater than the opening in the passivation layer 213, as is, for instance, shown with respect to FIG. 1 in step 120. The process techniques for forming the resist mask 221 in accordance with design requirements are well established and thus these techniques are not described in detail herein.

In step 230, solder material may be deposited by electroplating, in that at least the current distribution layer 217 is connected to a respective current source while the substrate 211 is exposed to an appropriate plating solution including ions of the materials to be deposited. For instance, lead and tin are frequently used as solder materials in various mixtures to form eutectic or high melting solder bumps. In other illustrative embodiments, substantially lead-free solder materials comprising, for instance, tin, tin/silver, gold, tin/gold and the like may be used. By correspondingly controlling process parameters, such as the plating time for a known deposition rate, the height of a solder bump 231 may be adjusted to substantially conform with a predetermined target value. It should also be appreciated that the size and shape of the solder bump 231 as well as the pitch to any neighboring solder bumps (not shown) may be selected in conformity with device requirements, such as heat dissipation capability, current drive capability, number of electrical connections required, and the like, rather than by establishing a design for the configuration of a plurality of solder bumps 231 on the basis of etch specific characteristics, as is the case in the conventional process flow 100 described with reference to FIG. 1.

In step 240, the resist mask 221 is removed by well-established techniques, such as dry etching on the basis of an oxygen plasma and/or well-established wet chemical resist removal processes. Thus, the substrate 211 now comprises a plurality of solder bumps 231 of specified shape and height (only one of which is shown in FIG. 2a).

In step 250, a plasma etch process 251 is performed to pattern the underbump metallization layer 214 in accordance with a specified layout to form a contact layer 252 including the plurality of solder bumps 231 formed on respective underbump metallization islands, the size of which is defined by the plasma etch process 251. In one illustrative embodiment, the plasma etch process 251 is performed without any additional etch mask so that, due to the highly anisotropic nature of the process 251, the size and shape of the patterned island of the underbump metallization 214 may substantially correspond to the size of the solder bump 231 without significant underetching, contrary to the conventional process flow. Since typically the layer 216 and/or 217 of the underbump metallization layer 214 may comprise chromium, copper or any alloys thereof, a first step of the plasma etch process 251 may be based on recipes as are also used in dry etching of chromium photolithography masks. In these anisotropic etch processes, an argon-based plasma is maintained throughout the whole etch procedure by an appropriate chamber configuration to efficiently remove chromium and chromium alloys as well as copper. In some embodiments, the etch process 251 may comprise a second different plasma etch step for removing the adhesion layer 215, which may be comprised of titanium, titanium tungsten and the like. For this purpose, well-established etch procedures on the basis of hydrogen, nitrogen, oxygen, sulphur fluoride and carbon fluoride may be used to remove exposed portions of the adhesion layer 215. After patterning of the adhesion layer 215, the plasma etch process 251 may, in some illustrative embodiments, be continued to remove contaminants from the solder bump 231, such as organic residues from the photoresist, metallic contaminants deposited during the removal of the exposed portions of the underbump metallization layer 214, or any byproducts created during the etch process 251. In some embodiments, the etch chemistry of the plasma etch process 251 may be appropriately adapted, at least at a final phase thereof, to achieve the desired cleaning effect. For example, an etch chemistry as specified above for removing the adhesion layer 215 may be used that differs from the chemistry used during etching the barrier layer 216 and/or the layer 217, and the etch process with this chemistry may be continued until the required cleaning effect is achieved. In some embodiments, two or more of the individual plasma etch steps of the process 251 may be performed as in situ process, thereby enabling a high tool utilization in combination with low production costs.

In step 280, the contact layer 252 may be tested with respect to its electrical and/or mechanical behavior to estimate the product reliability and also to identify faulty solder bumps. Hence, according to the embodiment shown in FIG. 2a, the solder bumps 231 may be subjected to any test procedures in a non-reflowed configuration, wherein, in one particular embodiment, even any additional cleaning steps after the step 250 may be avoided. Thus, compared to the conventional process flow as shown in FIG. 1, a significant reduction of process complexity may be achieved in addition to the advantages provided by the plasma etch process 250 and by the possibility of designing the contact layer 252 substantially without restrictions to any wet chemical etch processes. It should further be appreciated that the solder bumps 231 may be designed such that essential portions of the sidewalls thereof remain covered by at least the adhesion layer 215, even if any reaction between the solder material and the layers 216 and/or 217 may have been initiated to form an intermetallic phase. Consequently, during the further substrate handling or testing of the contact layer 252 and any subsequent processes, or after assembly, a solder bump degradation caused by, for instance, oxidation may significantly be reduced.

In step 290, a device may be assembled by attaching a carrier substrate 291 having formed thereon respective contact pads 292 to the contact layer 252 with the solder bumps 231 aligned to the contact pads 292. For assembling the substrates 211 and 291, the carrier substrate 291 is brought into contact with the contact layer 252 and the solder bumps 231 are reflowed to form a direct connection to the contact pads 292. Depending on the initial configuration of the solder bumps 231, the sidewalls of the resulting solder balls may substantially remain covered by the adhesion layer 215 and the barrier layer 216, thereby suppressing a migration of solder components, which may, for instance, be present on the contact pad 292, into sensitive device areas. Moreover, the high degree of shape "fidelity" of the solder bumps due to the lack of cleaning processes and reflow in combination with the superior etch behavior also enhances the reliability of the assembling process when the solder bumps 231 are brought into contact with the contact pads 292. As a result, the solder bumps 231 may be tested in their non-cleaned and non-reflowed configuration, while nevertheless a highly reliable assembling process may be achieved. Moreover, a high degree of flexibility in designing the layout of the contact layer 252 may be accomplished. Therefore, high cost efficiency in combination with performance enhancement may be gained.

FIG. 2b schematically shows the top view of the substrate 211 with the contact layer 252 facing the viewer. A plurality of solder bumps 231 are illustrated in accordance with a specified geometrical configuration. Hereby, the notion geometrical configuration is to be understood as the position of the individual solder bumps 231 in the contact layer 252, and/or the size of the individual solder bumps 231, i.e., their lateral dimensions, for instance a diameter 231c, as well as their height. Moreover, in the exemplary embodiment shown, a plurality of different pitches 231a, 231b are illustrated to indicate a locally varying "pattern density." The exemplary arrangement of the plurality of solder bumps 231 may, contrary to conventional approaches, be entirely established and designed in accordance with device requirements rather than based on constraints prescribed from the highly complex wet or electrochemical etch process for patterning an underbump metallization layer in a conventional fashion. That is, the arrangement and thus the layout of the contact layer 252 may be selected on the basis of their current and heat conductivity capabilities of the solder bumps 231 and/or on the basis of the characteristics of a metallization layer stack (not shown) formed below the contact layer 252 to provide electrical contact to at least some of the solder bumps 231, and/or on the basis of the complexity of routings in the carrier substrate 219 (FIG. 2a), from which the electrical connections to external devices are provided when attached to the substrate 211, and/or on the basis of pitch and size requirements for the individual solder bumps 231, and the like. For instance, if a certain area of the contact layer 252 may require a high density of solder bumps 231, for instance due to a necessity for an increased number of I/O (input/output) terminals for this circuit portion, a specified routing of the associated portion of the metallization layer stack may be designed such that with respect to device performance, e.g., signal propagation delay and the like, a specified target behavior is obtained. This may require a certain arrangement of solder bumps within the contact layer 252, which may, according to illustrative embodiments, be selected substantially without restrictions with respect to process constraints during the process flow 200 as is, for instance, described with reference to FIG. 2a. Similarly, the arrangement of the plurality of solder bumps 231 may be selected on one or more of the device requirements specified above to arrive at an enhanced overall device performance. As a result, the design of the metallization layer stack, the contact layer 252 and the carrier substrate 291 and even of the individual solder bumps 231 may be established in a more flexible manner, thereby taking into consideration device specific requirements, which may directly translate into a performance enhancement.

Thus, in particular embodiments of the present invention, metallization layers and/or contact layers and/or the individual configuration of solder bumps of existing microelectronic chip designs may be re-designed on the basis of the above considerations to obtain an enhanced device performance. In other embodiments, the design of microelectronic circuit chips to be newly developed may be based upon the above-identified criteria from the start, thereby providing the potential for obtaining highly efficient circuit layouts. For instance, in many cases, highly sensitive circuit areas, intended for signal processing, and which may be combined with power applications requiring the handling of moderately high currents, may more effectively be designed to provide corresponding portions within the contact layer 252 that enable an appropriate current and heat dissipation capability, while other portions of the contact layer 252 may be tailored to achieve enhanced signal processing performance. It should be appreciated that the provision of an adapted design of the metallization layer stack and/or the contact layer 252 and/or the individual solder bumps 231 requires a corresponding adaptation of the lithography 220 and may also require an adaptation of the step 280 for testing the contact layer 252. While the adaptation of the lithography step 220 is typically not associated with any addition of process complexity as merely the lithography mask has to be adapted to the new design, the testing 280 may in some embodiments even provide a reduced process complexity, as the test procedures may be considered as device requirements, which may also be taken into consideration when re-designing or designing a corresponding arrangement of the finally attained arrangement of the solder bumps 231. For example, the arrangement of the solder bumps 231 may also be established on the criterion of connectivity to test devices and the like.

FIG. 2c schematically shows the process flow 200 in accordance with further illustrative embodiments of the present invention. After the step of patterning the underbump metallization layer 214 by the plasma etch process 250, a further additional cleaning step 260 may be performed to remove contaminants and etch byproducts from surface portions of the contact layer 252 and especially from surface portions of the solder bumps 231. The cleaning step 260 may not necessarily be designed as a dry etch process but may include any wet chemical and/or dry chemical etch processes as may be required to remove resist residues, metallic contaminants and the like prior to performing the test step 280 on the solder bumps 231 in their cleaned configuration. Consequently, by adding the additional cleaning step 260, the reliability of the solder bumps 231 may significantly be enhanced while nevertheless the overall process complexity of the process flow 200 as shown in FIG. 2c is significantly less compared to the conventional process flow 100. In some embodiments, the solder bumps 231 may be designed such that the sidewalls thereof may substantially completely be covered by the underbump metallization layer 214, as is previously described with reference to FIG. 2a, thereby allowing the employment of highly effective clean procedures without unduly affecting the solder bumps 231 as in these embodiments merely the top surface thereof is exposed to the reactive cleaning ambient.

FIG. 2d schematically shows the process flow 200 in accordance with yet a further illustrative embodiment of the present invention. Hereby, the solder bumps 231 having experienced a preceding clean process in step 260 may be subjected to a subsequent reflow process in step 270 in order to form an intermetallic phase at least with a portion of the underbump metallization layer 214, such as the layer 217, and thus create a mechanically reliable connection to the underlying contact pad 212. Moreover, depending on the initial size and shape of the solder bumps 231, the reflow step 270 may provide the solder bumps 231 in a reshaped configuration, thereby forming reshaped solder balls 271. Consequently, the following test procedure 280 may be performed on the basis of the solder balls 271, which exhibit substantially the same current drive and heat dissipation capabilities as are encountered after the final assembling step 290, in which a further reflow step is performed to connect the solder balls 271 with the corresponding contact pads 292 of the carrier substrate 291. Hence, the reliability assessment of the solder balls 271 during the test process 280 may be enhanced while still improved process efficiency is achieved in addition to the overall flexibility advantages with respect to contact layer design.

As a result, the present invention provides a novel process flow, in which the novel combination of processes used in various fields of the semiconductor industry, such as plasma-based etch procedures for chromium, chromium alloys, copper and the like, and processes for forming a contact layer and assembling the same to a carrier substrate results in an overall process flow that is a highly independent on structural characteristics such as pattern density. Consequently, a high degree of reduction of process complexity and design flexibility is achieved for the formation of contact layers of microelectronic chips and the attaching of a carrier substrate to solder bumps or solder balls formed on the contact layer. Due to the highly anisotropic nature of the plasma-based patterning process for the underbump metallization layer and due to a high degree of independency of the etch behavior from solder bump arrangement, the substrate and die layout restrictions, imposed on the conventional process flow, may be reduced, thereby providing the potential for a significant cost reduction of the solder bump technology and/or a significant improvement of device performance, since the contact layer design may be established on the basis of device requirements rather than taking into consideration the constraints imposed by the conventional complex wet or electrochemical etch procedure. Moreover, in some embodiments, highly cost-efficient approaches may be realized, in which no additional cleaning steps are required after patterning of the underbump metallization layer, wherein even any reflow processes are not carried out prior to testing and assembling the device. Moreover, in some embodiments, significant enhancements with respect to performance and processing may be gained when the sidewalls of the solder bump or solder ball remain covered by the underbump metallization layer or at least one or more sub-layers thereof. Thus, a further degradation of the solder bump surface, i.e., an oxidation thereof, may substantially be prevented. Consequently, well-known reliability issues, such as the climbing of solder material, such as tin, as components of the package contact pad solder may significantly be reduced, since covering the sidewalls of the solder bump may effectively suppress the climbing of the solder material. Moreover, in highly efficient embodiments, without an additional cleaning step after patterning the underbump metallization layer, the top surface of the solder bump may efficiently be cleaned during the plasma-based dry etch process used to pattern the underbump metallization layer. During this patterning process, organic residues from previous process steps, i.e., resist coating and stripping, electroplating and the like, may effectively be removed. Thus, even without additional cleaning steps, a high degree of reliability of the resulting electrical connection is obtained. Furthermore, the technology approach of the present invention is highly scalable with respect to solder bump pitches and sizes thereof.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a substrate of a semiconductor device having formed thereon an underbump metallization layer and a plurality of solder bumps formed above said underbump metallization layer;
establishing a layout configuration for said plurality of solder bumps based upon device-specific requirements of said semiconductor device, wherein etch-specific characteristics of a plasma etch process to be performed to pattern said underbump metallization layer are not considered in establishing said layout configuration;
patterning said underbump metallization layer by said plasma etch process to form a contact layer for contacting a second substrate; and
testing said contact layer with respect to at least one of electric and mechanical functionality.

2. The method of claim 1, wherein said underbump metallization layer comprises an adhesion layer and a barrier layer and wherein said plasma etch process comprises a first plasma etch step for removing said barrier layer and a second plasma etch step for removing an exposed portion of said adhesion layer.

3. The method of claim 1, wherein said plurality of solder bumps is used as an etch mask during patterning of said underbump metallization layer.

4. The method of claim 1, further comprising cleaning said plurality of solder bumps and reflowing said cleaned solder bumps to form solder balls prior to testing said contact layer.

5. The method of claim 4, further comprising attaching said contact layer to a second substrate by bringing said solder balls into contact with respective contact areas of the second substrate and reflowing said solder balls.

6. The method of claim 1, wherein said device-specific requirements of said semiconductor device comprise at least one of geometrical, electrical and heat dissipation constraints.

7. The method of claim 6, wherein said device-specific geometrical, electrical and heat dissipation constraints of said semiconductor device comprise at least one of:
a number of required solder bumps;
a target pitch between neighboring solder bumps;
a minimum size of the solder bumps;
a complexity of routings in a second substrate to be attached to said contact layer for electrically connecting said contact layer with an external device;
a complexity of routings in a metallization layer stack of said substrate, said metallization layer stack being electrically connected to at least some of the plurality of solder bumps;
a heat dissipation capability of at least some of the plurality of solder bumps; and
a current drive capability of at least some of the plurality of solder bumps.

8. The method of claim 1, wherein said plasma etch process comprises two or more etch steps with different etch chemistry, wherein at least two of the etch steps are performed as in situ processes.

* * * * *